US011094790B2

(12) United States Patent
Oritsuki et al.

(10) Patent No.: US 11,094,790 B2
(45) Date of Patent: Aug. 17, 2021

(54) SILICON CARBIDE SEMICONDUCTOR DEVICE

(71) Applicant: Mitsubishi Electric Corporation, Tokyo (JP)

(72) Inventors: Yasunori Oritsuki, Tokyo (JP); Yoichiro Tarui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/331,992

(22) PCT Filed: Sep. 23, 2016

(86) PCT No.: PCT/JP2016/077944

§ 371 (c)(1),
(2) Date: Mar. 11, 2019

(87) PCT Pub. No.: WO2018/055719

PCT Pub. Date: Mar. 29, 2018

(65) Prior Publication Data

US 2019/0259845 A1 Aug. 22, 2019

(51) Int. Cl.

*H01L 29/417* (2006.01)
*H01L 29/06* (2006.01)

(Continued)

(52) U.S. Cl.

CPC ........ *H01L 29/41741* (2013.01); *H01L 27/04* (2013.01); *H01L 29/0619* (2013.01);

(Continued)

(58) Field of Classification Search

CPC ....... H01L 29/1608; H01L 29/78–7815; H01L 29/401; H01L 29/41741; H01L 29/41775;

(Continued)

(56) References Cited

U.S. PATENT DOCUMENTS

2013/0020587 A1* 1/2013 Hino .................. H01L 29/1095 257/77
2013/0026494 A1* 1/2013 Oritsuki .............. H01L 29/7803 257/77
2013/0175549 A1* 7/2013 Okumura ............ H01L 27/0255 257/77

(Continued)

FOREIGN PATENT DOCUMENTS

CN 102870217 A 1/2013
JP 2012-109602 A 6/2012
WO 2011/125274 A1 10/2011

OTHER PUBLICATIONS

International Search Report issued in PCT/JP2016/077944; dated Dec. 27, 2016.

(Continued)

*Primary Examiner* — Bilkis Jahan
*Assistant Examiner* — Victor V Barzykin
(74) *Attorney, Agent, or Firm* — Studebaker & Brackett PC

(57) ABSTRACT

A present invention includes the following: a third impurity region having a second conductivity type and disposed in an outer peripheral region that is the outer periphery of a cell arrangement region in which a unit cell is disposed; a field insulating film disposed in the outer peripheral region; an interlayer insulating film; a first main electrode disposed on the interlayer insulating film. The third impurity region includes a fourth impurity region having the second conductivity type, having a higher impurity concentration than the third impurity region. A gate wire and a gate pad are disposed in the outer peripheral region. The fourth impurity region is adjacent to the cell arrangement region, surrounds at least a region below the gate pad, and is electrically connected to the first main electrode.

9 Claims, 16 Drawing Sheets

(51) Int. Cl.

| | |
|---|---|
| ***H01L 29/16*** | (2006.01) |
| ***H01L 29/40*** | (2006.01) |
| ***H01L 29/423*** | (2006.01) |
| ***H01L 29/739*** | (2006.01) |
| ***H01L 29/78*** | (2006.01) |
| ***H01L 27/04*** | (2006.01) |
| ***H01L 29/12*** | (2006.01) |

(52) U.S. Cl.
CPC .......... *H01L 29/0696* (2013.01); *H01L 29/12* (2013.01); *H01L 29/1608* (2013.01); *H01L 29/401* (2013.01); *H01L 29/41775* (2013.01); *H01L 29/42376* (2013.01); *H01L 29/7395* (2013.01); *H01L 29/78* (2013.01); *H01L 29/7802* (2013.01)

(58) Field of Classification Search
CPC ......... H01L 29/0696; H01L 29/66674–66734; H01L 29/0619
See application file for complete search history.

(56) References Cited

U.S. PATENT DOCUMENTS

2013/0313576 A1* 11/2013 Nakano .............. H01L 29/8611 257/77
2016/0163703 A1* 6/2016 Kaguchi ............ H01L 27/0922 257/77
2017/0092743 A1* 3/2017 Okumura .......... H01L 29/66734
2018/0308973 A1* 10/2018 Ebiike ................. H01L 29/7395

OTHER PUBLICATIONS

An Office Action; "Notice of Reasons for Refusal," issued by the Japanese Patent Office dated Jul. 9, 2019, which corresponds to Japanese Patent Application No. 2018-540551 and is related to U.S. Appl. No. 16/331,992; with English language translation.
An Office Action issued by the German Patent Office dated Aug. 17, 2020, which corresponds to German Patent Application No. 11 2016 007 257.0 and is related to U.S. Appl. No. 16/331,992 with English translation.

* cited by examiner

F I G. 1
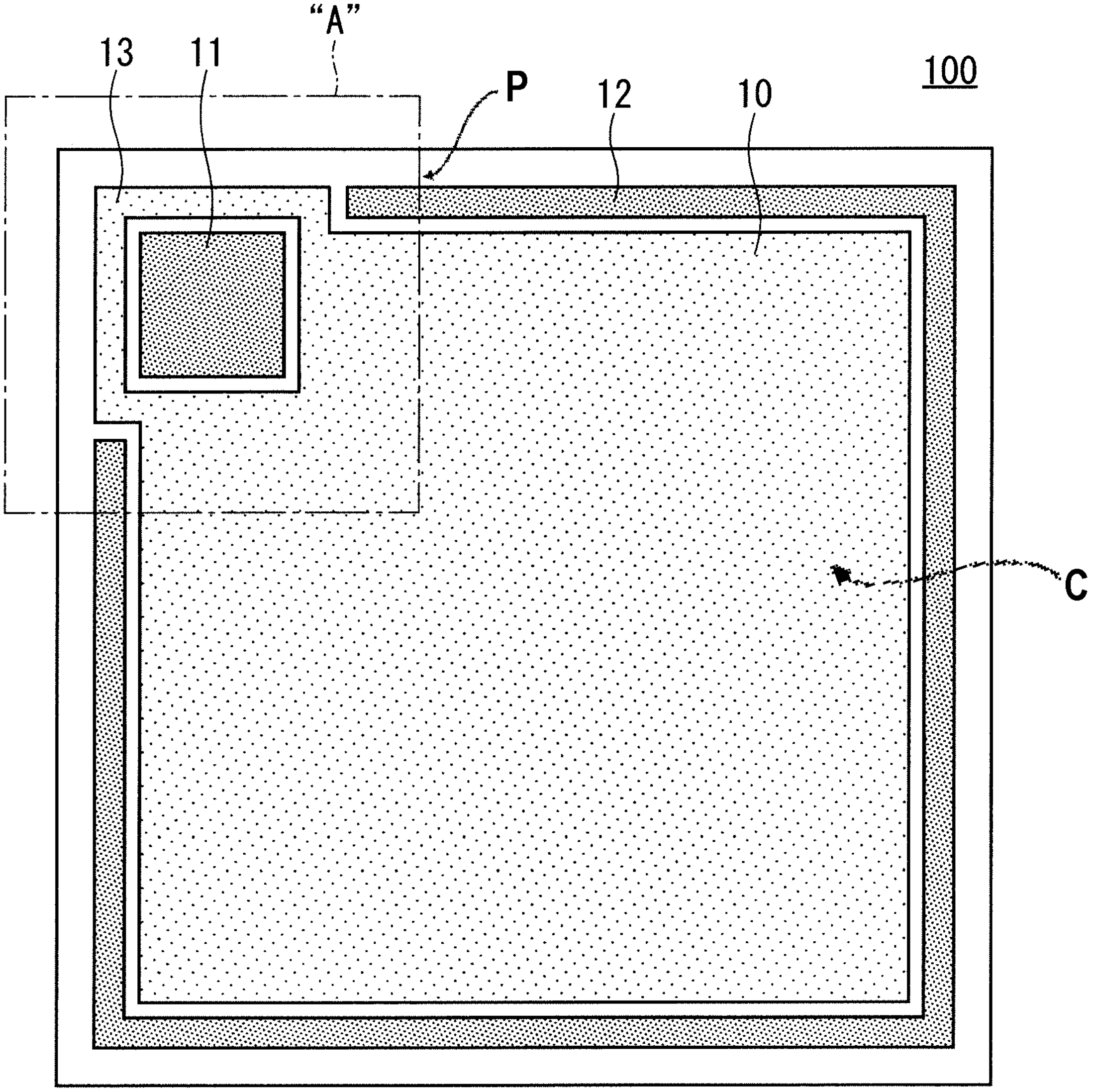

F I G. 2
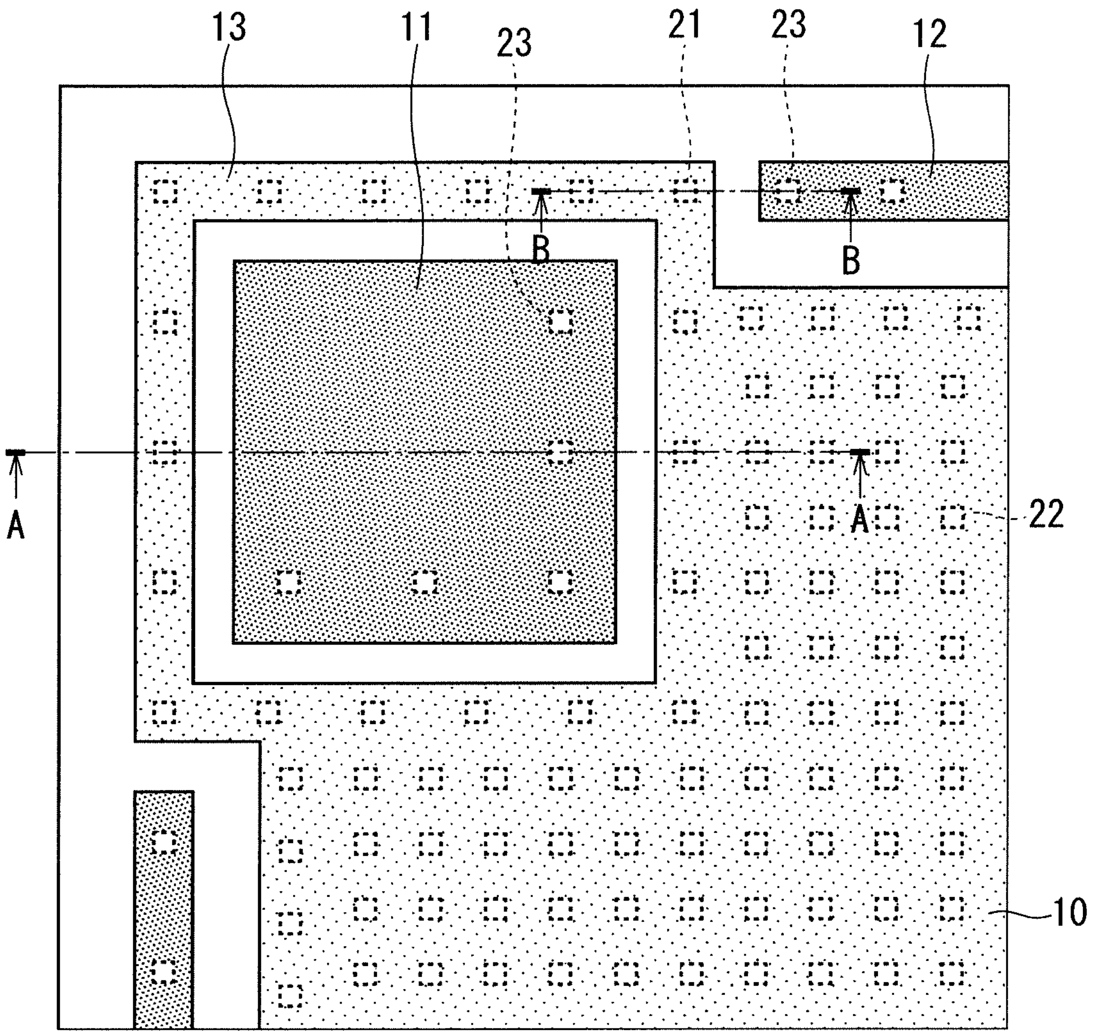

F I G. 5
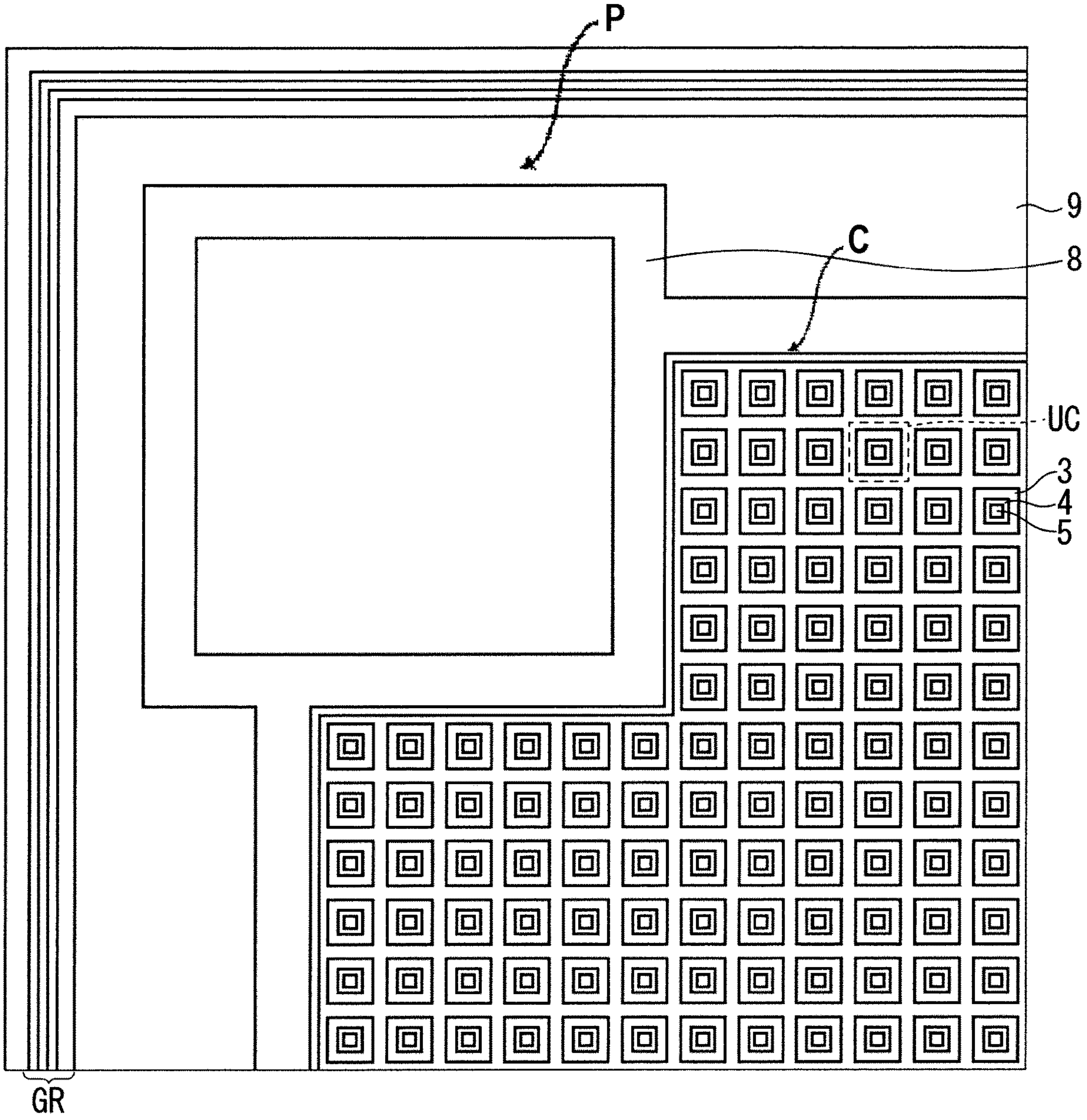

F I G. 8
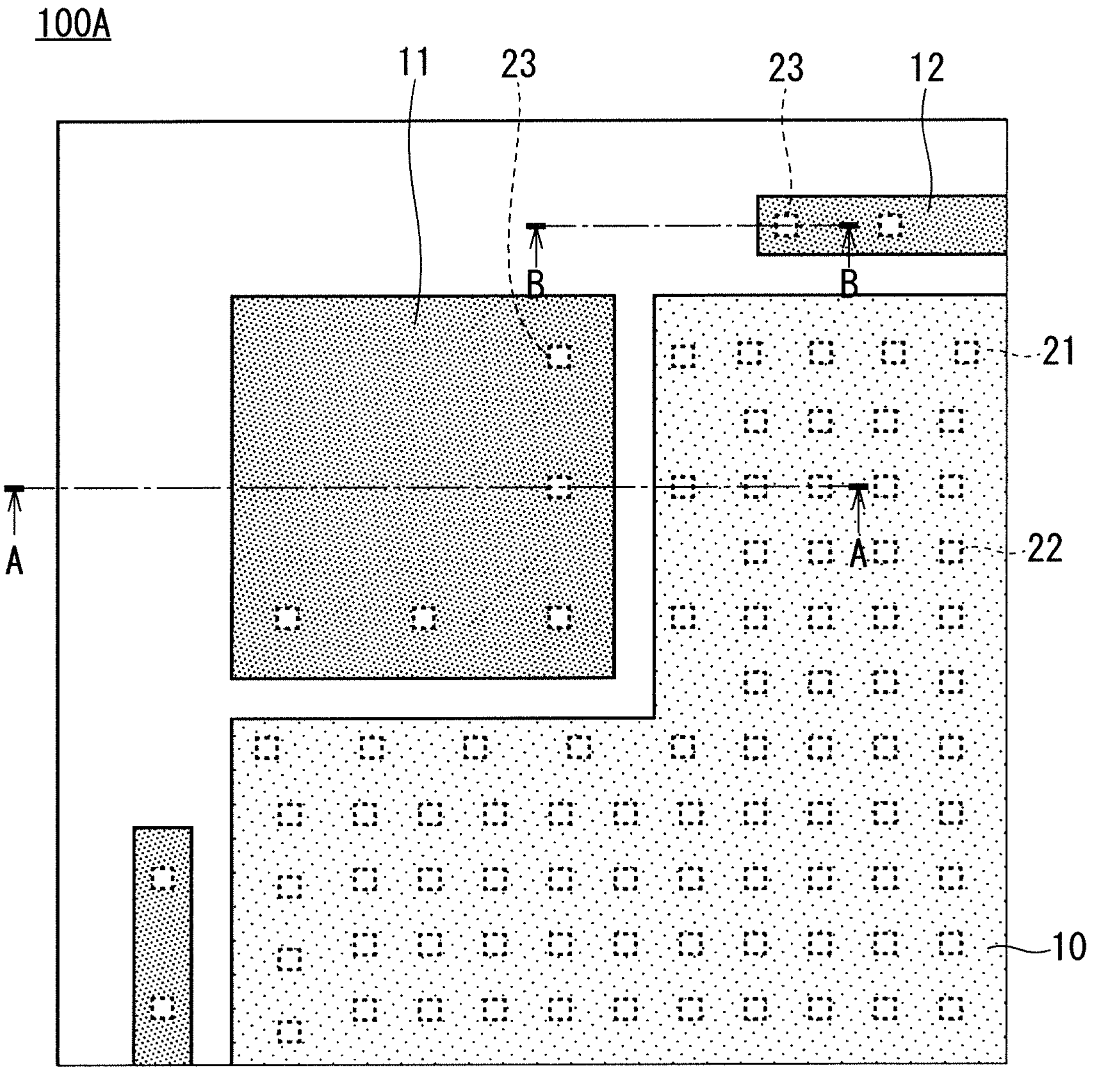

F I G. 1 1
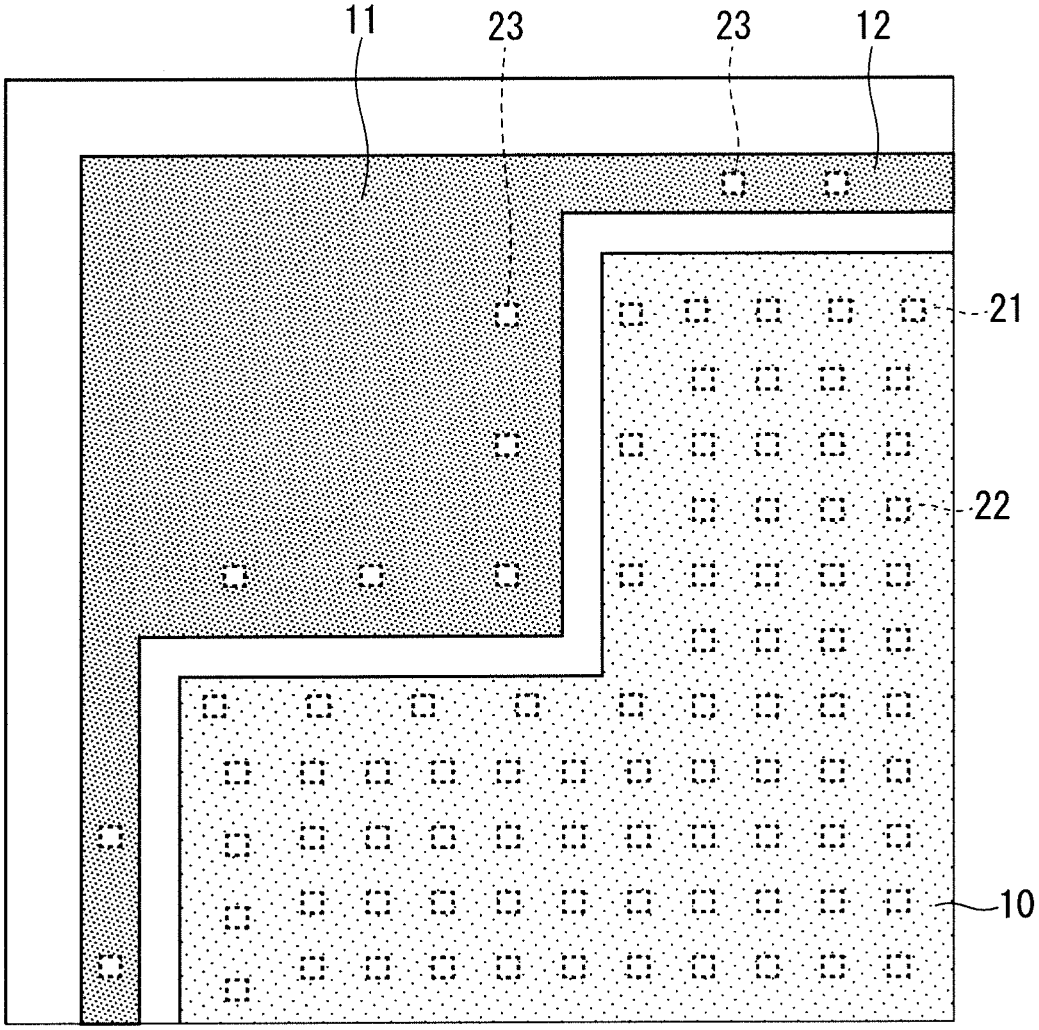

F I G. 1 2
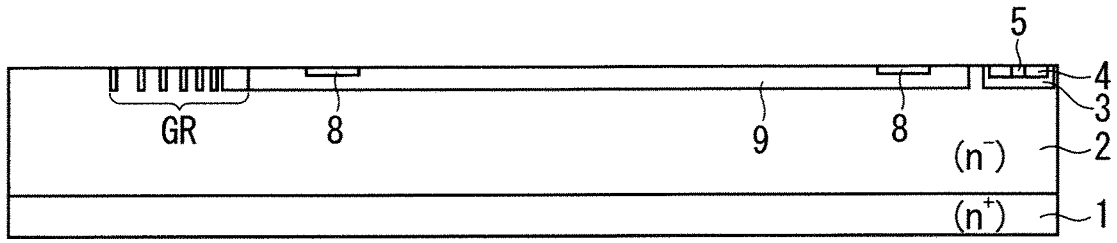
F I G. 1 3
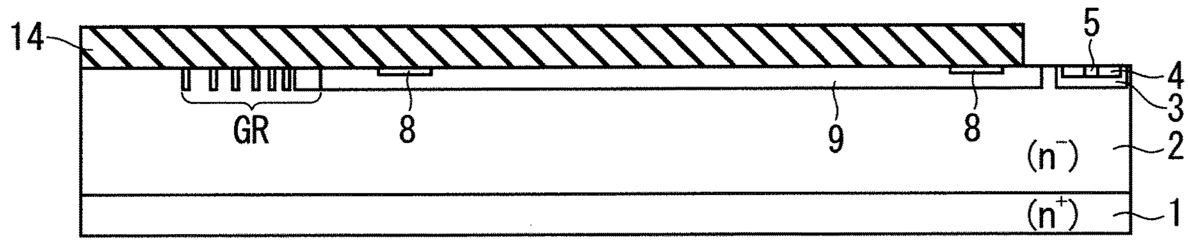
F I G. 1 4
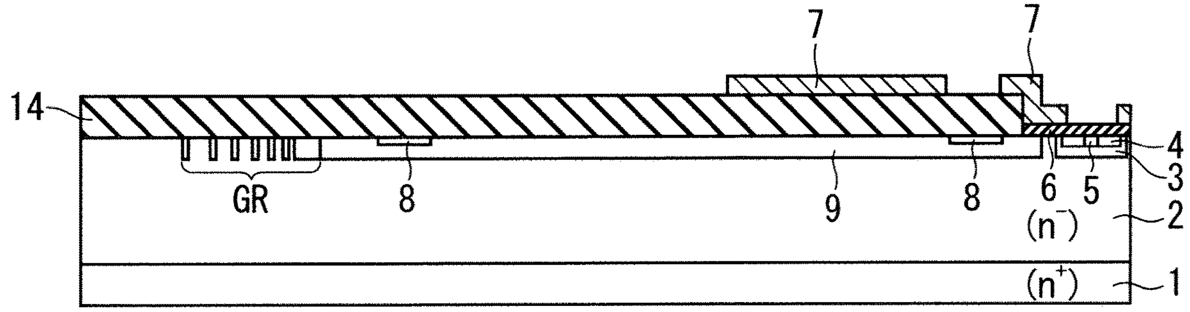

F I G. 1 9
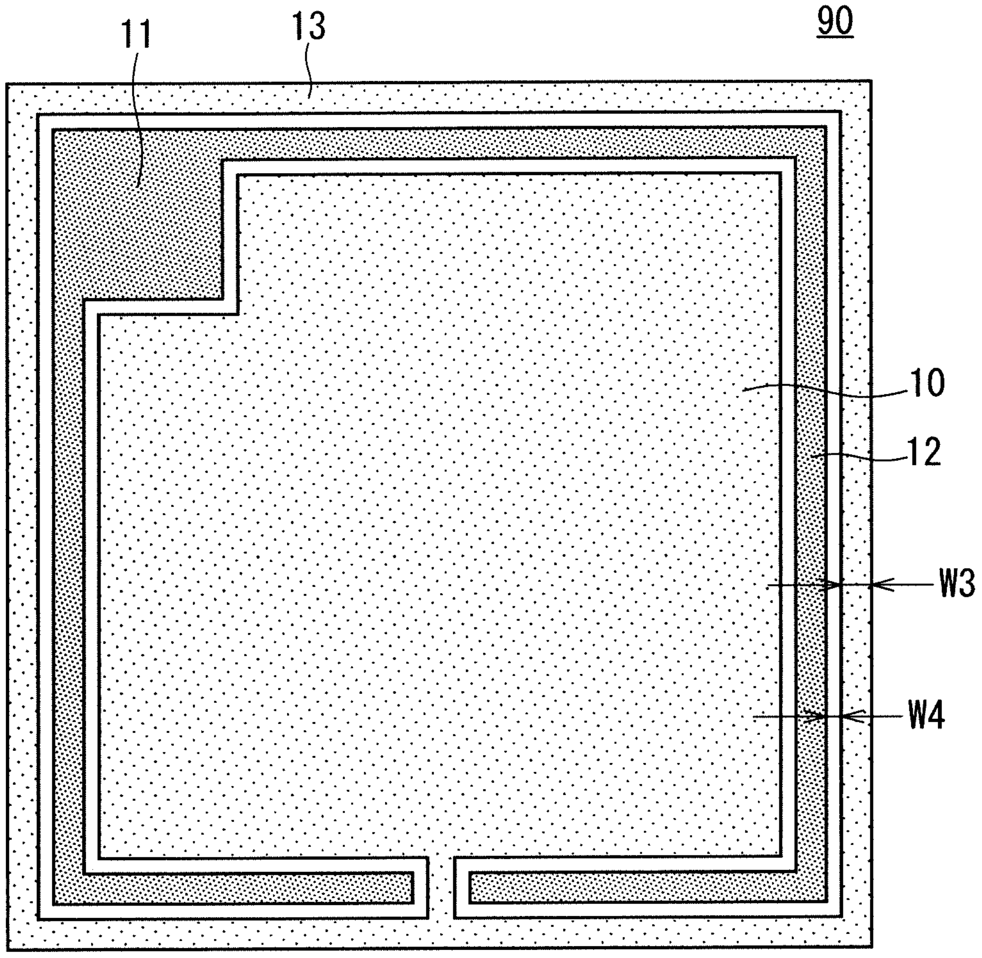

F I G. 2 0
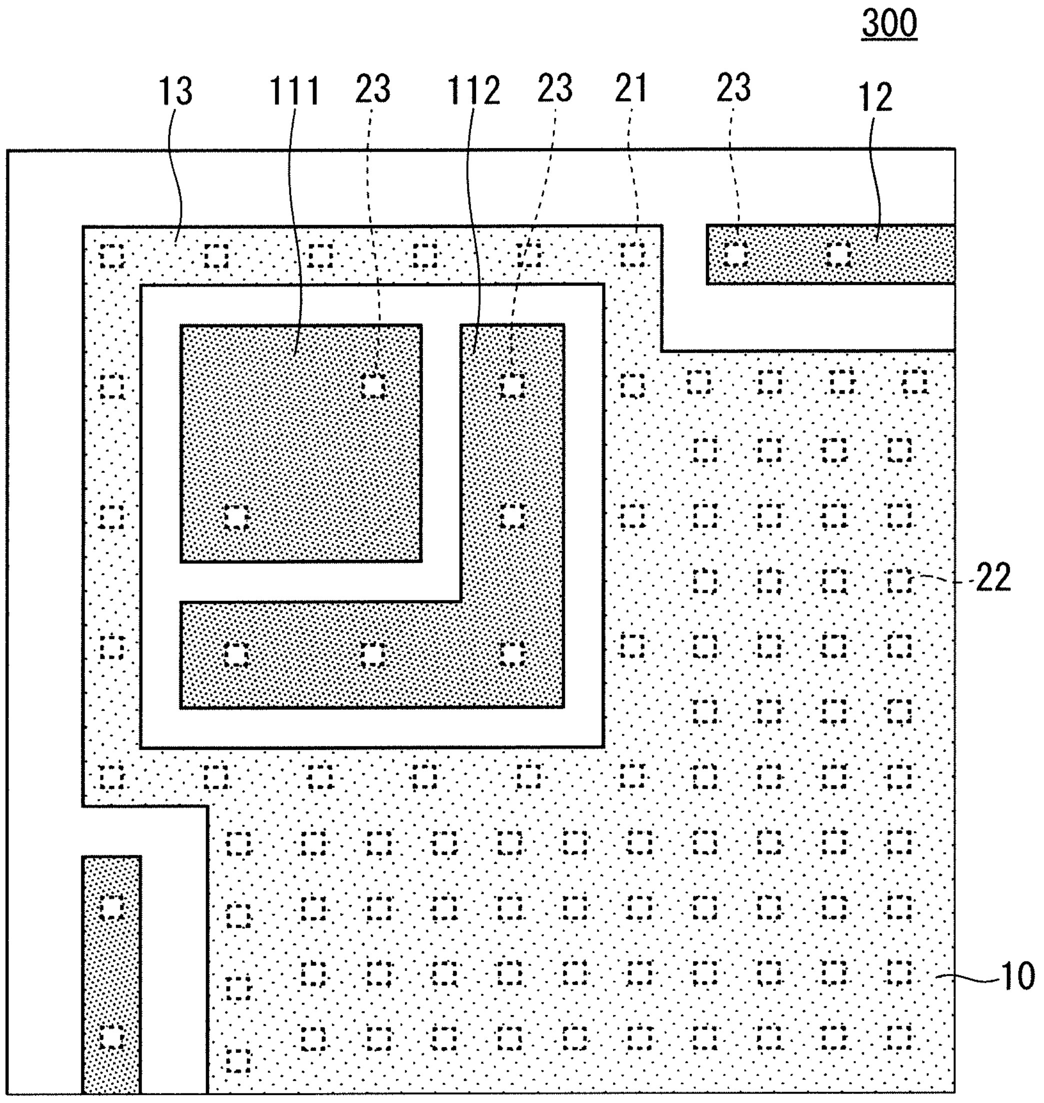

F I G. 2 2
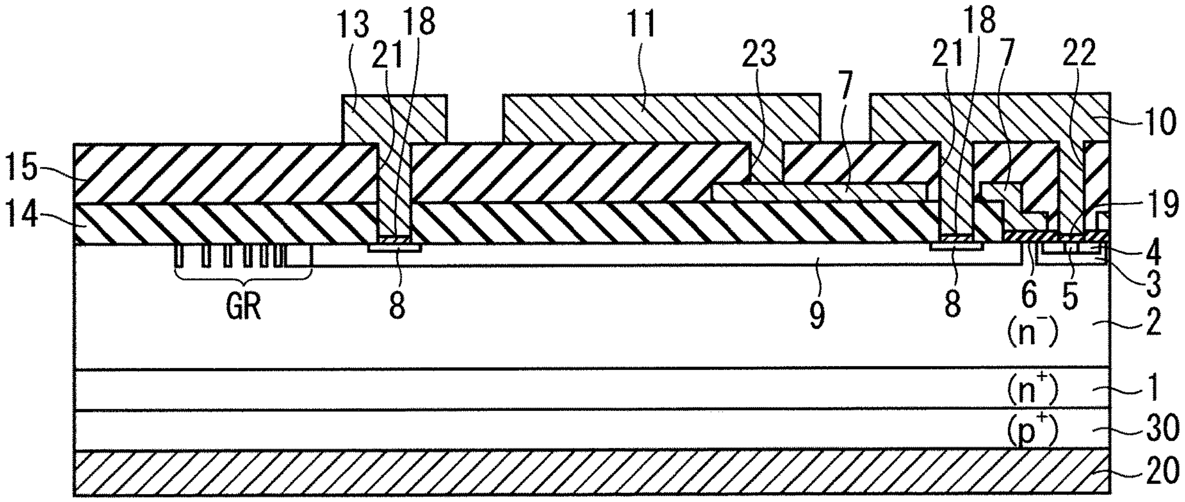

SILICON CARBIDE SEMICONDUCTOR DEVICE

TECHNICAL FIELD

The present invention relates to silicon carbide semiconductor devices.

BACKGROUND ART

Patent Document 1 discloses a power semiconductor device that suppresses dielectric breakdown between a gate electrode and a source electrode while a metal-oxide-semiconductor field-effect transistor (MOSFET) switches. Changing a voltage applied to the gate (gate pad) of the MOSFET so that the MOSFET switches from ON to OFF abruptly raises a voltage applied to the drain (drain electrode) of the MOSFET from substantially zero volts to several hundred volts. As indicated by an arrow in FIG. 7, the voltage rise causes a displacement current to flow through both p-type and n-type impurity regions, thus producing a potential difference under the gate pad. Patent Document 1 describes electrically connecting a second well region to a source pad via a second well contact hole that reaches the second well region within a drift layer below the gate pad, to thus feed the displacement current, which flows through the second well region, into the source pad.

The second well contact hole can suppress the potential difference under the gate pad. For a large gate pad or for rapid switching, however, the second well contact hole cannot sufficiently suppress the potential difference, thus possibly involving the dielectric breakdown of an insulating film under the gate pad.

PRIOR ART DOCUMENTS

Patent Documents

Patent Document 1: Japanese Patent Application Laid-Open No. 2012-109602

SUMMARY

Problem to be Solved by the Invention

A semiconductor device using a wide-bandgap semiconductor, especially a silicon carbide semiconductor device includes a p-type region under a gate pad, the p-type region being commonly formed through implantation of aluminum (Al) or boron (B) ions. Al or B, when injected into silicon carbide, has a deep impurity level; in addition, the recovery of a defect resulting from ion implantation is difficult. For this reason, the dose of Al or B is difficult to increase. In addition, a p-type region of a silicon carbide semiconductor device has a larger resistance than a p-type region of a silicon (Si) semiconductor device. As such, the silicon carbide semiconductor device tends to involve the dielectric breakdown of the insulating film under the gate pad when compared to the Si semiconductor device.

To solve this problem, it is an object of the present invention to provide a silicon carbide semiconductor device that suppresses the dielectric breakdown of an insulating film under a gate pad.

Means to Solve the Problem

A silicon carbide semiconductor device according to the present invention includes the following: a semiconductor substrate of silicon carbide; a first impurity region having a second conductivity type and selectively disposed in the upper layer of the semiconductor layer; a second impurity region having the first conductivity type and selectively disposed in the upper layer of the first impurity region; a gate insulating film provided to be continuously in contact with the second impurity region, the first impurity region, and the semiconductor layer; a gate electrode disposed in a position facing the second impurity region, the first impurity region, and the semiconductor layer via at least the gate insulating film; a third impurity region having the second conductivity type, the third impurity region being disposed in the upper layer of the semiconductor layer in an outer peripheral region that is the outer periphery of a cell arrangement region in which a unit cell including the first and second impurity regions is disposed; a field insulating film that is disposed on the semiconductor layer in the outer peripheral region, and is thicker than the gate insulating film; an interlayer insulating film disposed on the field insulating film, the gate electrode, and the gate insulating film; a first main electrode disposed on the interlayer insulating film; a second main electrode disposed across the semiconductor substrate from the semiconductor layer; and a gate wire and a gate pad electrically connected to each other via the gate electrode disposed on the field insulating film. The third impurity region includes a fourth impurity region having the second conductivity type, selectively disposed in the upper layer of the third impurity region, and having a higher impurity concentration than the third impurity region. The gate wire and the gate pad are disposed in the outer peripheral region. The fourth impurity region is provided to be adjacent to the cell arrangement region and to surround at least a region below the gate pad, and is electrically connected to the first main electrode.

Effects of the Invention

The present invention suppresses the dielectric breakdown of the insulating film under the gate pad.

BRIEF DESCRIPTION OF DRAWINGS

FIG. 1 is a plan view of the configuration of the upper surface of a silicon carbide semiconductor device according to a first embodiment of the present invention.

FIG. 2 is a partial enlarged view of the configuration of the upper surface of the silicon carbide semiconductor device according to the first embodiment of the present invention.

FIG. 5 is a plan view of the shape of an impurity region of the silicon carbide semiconductor device according to the first embodiment of the present invention.

FIG. 8 is a partial enlarged view of the configuration of the upper surface of a silicon carbide semiconductor device according to a modification of the first embodiment.

FIG. 11 is a partial enlarged view of the configuration of the upper surface of a silicon carbide semiconductor device according to a modification of the first embodiment.

FIG. 12 is a cross-sectional view of a process step in manufacturing the silicon carbide semiconductor device according to the first embodiment of the present invention.

FIG. 13 is a cross-sectional view of a process step in manufacturing the silicon carbide semiconductor device according to the first embodiment of the present invention.

FIG. 14 is a cross-sectional view of a process step in manufacturing the silicon carbide semiconductor device according to the first embodiment of the present invention.

FIG. 19 is a plan view of the configuration of the upper surface of a silicon carbide semiconductor device for comparison with the silicon carbide semiconductor device according to the first embodiment of the present invention.

FIG. 20 is a partial enlarged view of the configuration of the upper surface of a silicon carbide semiconductor device according to a third embodiment of the present invention.

FIG. 22 is a cross-sectional view of an IGBT to which the present invention is applied.

DESCRIPTION OF EMBODIMENT(S)

<Note>

Figure 3:
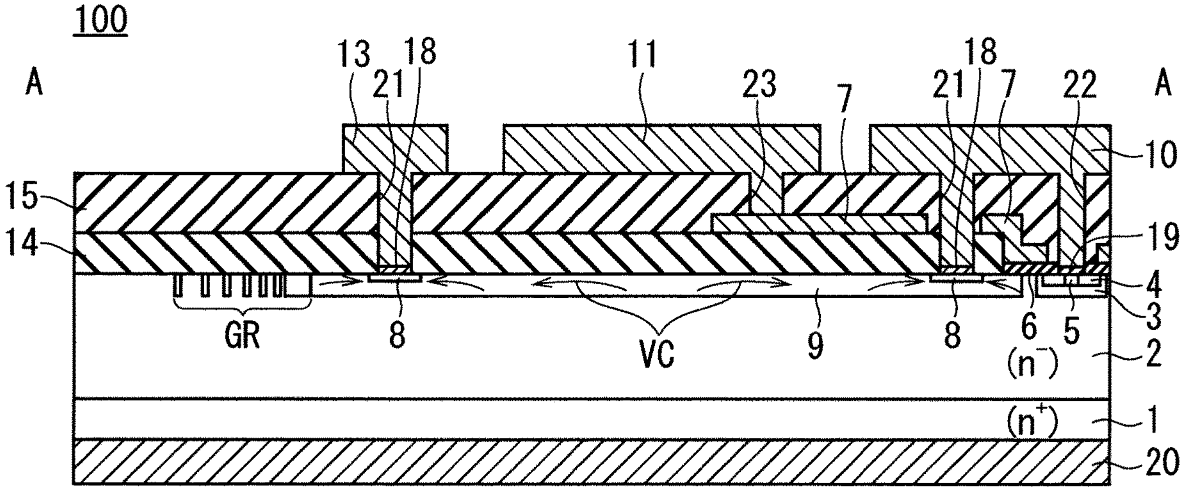
FIG. 3 is a cross-sectional view of the configuration of the silicon carbide semiconductor device according to the first embodiment of the present invention.

A long ago, the term, "MOS" is used in a structure in which metal, an oxide, and a semiconductor are joined together, and is an abbreviation for a "metal oxide semiconductor". In view of recent-year integration, improvement in fabrication processes, and other things, a field-effect transistor having a MOS structure (hereinafter simply referred to as a "MOS transistor"), in particular, includes a gate insulating film and a gate electrode that are made of improved material.

For instance, the MOS transistor includes a gate electrode of polycrystalline silicon instead of metal in order to form its source and drain in a self-aligned manner. Moreover, to improve electrical properties, the gate insulating film is made of a high-permittivity material, which is not always limited to an oxide.

As such, the term, "MOS" is not always used in only a stacked structure of metal, an oxide, and a semiconductor. Thus, the Description does not use this term based on such a limitation. That is, as a matter of technical common sense, the term, "MOS" herein is not only an abbreviation for its etymology, but also widely means a stacked structure of an electric conductor, an insulator, and a semiconductor.

Reference is made to conductivity types of impurity. N-type is generally defined as a "first conductivity type"; and p-type, as a "second conductivity type" in the following description. These definitions are reversible.

In the following description, the wording, "A and B are electrically connected to each other" means that a current flows between component A and component B.

First Embodiment

<Device Configuration>

FIG. 1 is a schematic plan view of the configuration of the upper surface of a silicon carbide semiconductor device according to a first embodiment of the present invention. More specifically, FIG. 1 is a schematic plan view of the configuration of the upper surface of a field-effect transistor (silicon carbide MOSFET) 100 disposed on a SiC substrate and having a MOS structure. Although the silicon carbide MOSFET 100 is a planar-gate MOSFET, the present invention is applicable to any type of MOSFET. Furthermore, the present invention may be applied to a Si semiconductor besides a SiC semiconductor. The present invention is effective, particularly when it is applied to a semiconductor device including a wide-bandgap semiconductor of, for instance, gallium nitride (GaN) or diamond (C).

As illustrated in FIG. 1, the silicon carbide MOSFET 100 is quadrangular in outer shape, and has a gate wire 12 along its outer edge. Moreover, the silicon carbide MOSFET 100 has a corner provided with a quadrangular gate pad 11.

A source electrode 10 (first main electrode) is disposed in most part of a main surface of the silicon carbide MOSFET 100 except in the locations where the gate pad 11 and the gate wire are disposed. The gate pad 11 is an island surrounded by the source electrode 10. Part of the source electrode 10 extends along two of the four sides of the gate pad 11 at a corner of the silicon carbide MOSFET 100. This part is called a source wire 13.

Disposed below the source electrode 10 is a cell arrangement region, identified as cell arrangement region C in FIGS. 1 and 5, in which a plurality of minimum-unit structures of the MOS, called "unit cells", are arranged. The unit cells each have a gate electrode (not shown) supplied, via the gate wire 12, with a gate voltage that is applied from an external control circuit (not shown) to the gate pad 11.

Various MOSFETs have various gate pads 11 with regard to position and number, have various gate wires 12 with regard to shape, and have various source electrodes 10 with regard to shape and number. Although the present invention is applicable to any form, the gate wire 12 needs to be disposed along any of the sides of the gate pad 11 that does not face the cell arrangement region in plan view.

FIG. 2 is an enlarged view of a region "A" in FIG. 1. As illustrated in FIG. 2, a plurality of well contact holes 21 are arranged under the source wire 13 and the source electrode 10, along the four sides of the gate pad 11. The well contact holes 21 surround the gate pad 11. Furthermore, the well contact holes 21 are arranged not only around the gate pad 11, but also along the outer edge of the source electrode 10 to be adjacent to the cell arrangement region.

A plurality of gate contact holes 23 are arranged under the gate pad 11 and the gate wire 12. Moreover, a plurality of source contact holes 22 are arranged under the source electrode 10 over the cell arrangement region so as to conform with the unit cell arrangement.

The following describes the configuration of a cross-section taken along line A-A in FIG. 2, with reference to a cross-sectional view in FIG. 3 As illustrated in FIG. 3, the silicon carbide MOSFET 100 is disposed on a SiC substrate 1 that contains a relatively high concentration ($n^+$) of n-type (first conductivity type) impurities.

The SiC substrate 1 has a front main surface provided with a semiconductor layer 2 containing a relatively low concentration (n) of n-type impurities. The semiconductor layer 2 is an epitaxial growth layer for instance, and is hereinafter called a drift layer 2 (semiconductor layer).

The drift layer 2 has an upper layer provided with a plurality of well regions 3 (first impurity regions) that contain p-type (second conductivity type) impurities in the cell arrangement region and that are selectively arranged. The well regions 3 have upper layers provided with contact regions 5 (fifth impurity regions) that contain a relatively high concentration ($p^+$) of p-type impurities and that are selectively arranged. The contact regions 5 are surrounded by $n^+$ source regions 4 (second impurity regions). The contact regions 5, although provided for reducing a contact resistance, are not essential components.

The well regions 3 and the source regions 4 each concentrically surround the contact region 5 in plan view; moreover, the depth of the well region 3 from the uppermost surface of the drift layer 2 is greater than the depth of the source region 4 and contact region 5 from the uppermost surface of the drift layer 2. The details will be described later on.

In an outer peripheral region, identified as outer peripheral region P in FIGS. 1 and 5, which is the outer periphery of the cell arrangement region, disposed in the upper layer of the drift layer 2 is an outer-periphery well region 9 (third impurity region) containing p-type impurities. The outer-periphery well region 9 extends to a region below the source wire 13. Outside the outer-periphery well region 9, arranged in the upper layer of the drift layer 2 are a plurality of guard ring regions GR spaced away from each other. The upper layer of the outer-periphery well region 9 is provided with an outer-periphery contact region 8 (fourth impurity region) that contain a relatively high concentration ($p^+$) of p-type impurities and that are selectively disposed. Arranged on the outer-periphery contact region 8 is an outer-periphery well contact film 18. That is, the outer-periphery contact region 8 is adjacent to the cell arrangement region, and is disposed at the edge of the outer peripheral region. In addition, the outer-periphery well contact film 18 is disposed on the outer-periphery contact region 8.

In the cell arrangement region, a gate insulating film 6 is disposed on the drift layer 2; moreover, disposed on the gate insulating film 6 is a gate electrode 7. That is, a junction-field-effect-transistor (JFET) region is disposed between the edges on the upper surfaces of the adjacent well regions 3; moreover, the gate electrode 7 is disposed on the gate insulating film 6 extending from the JFET region to the edge of the well region 3.

In a region on the periphery of the cell arrangement region, disposed on the drift layer 2 is a field insulating film 14 with a thickness of 0.5 to 2 μm that is thicker than the gate insulating film 6. The gate electrode 7 is disposed also on the field insulating film 14.

The gate insulating film 6 covers almost the enter main surface of the drift layer 2 in the cell arrangement region. Not the gate insulating film 6, but a source contact film 19 is disposed in the upper part of the contact region 5 and part of the upper part of the surrounding source region 4.

An interlayer insulating film 15 having a thickness of 0.5 to 2 μm is disposed on the gate electrode 7, the gate insulating film 6, and the field insulating film 14. The source contact hole 22 is disposed in the cell arrangement region so as to extend through the interlayer insulating film 15 to the source contact film 19. The well contact hole 21 is disposed in the outer-periphery well region 9, in a region where the outer-periphery contact region 8 is disposed so as to extend through the interlayer insulating film 15 and the field insulating film 14 to the outer-periphery well contact film 18. The gate contact hole 23 is disposed in the outer peripheral region so as to extend through the interlayer insulating film 15 to the gate electrode 7 on the field insulating film 14.

The source electrode 10, the gate pad 11, and the source wire 13 are selectively disposed on the interlayer insulating film 15. The source electrode 10 fills the source contact hole 22 and the well contact hole 21 that is adjacent to the cell arrangement region. The gate pad 11 fills the gate contact hole 23. The source wire 13 fills the well contact hole 21 at the edge of the outer peripheral region. Accordingly, the source region 4 is electrically connected to the source electrode 10 via the source contact hole 22. Further, the outer-periphery well region 9 is electrically connected to the source electrode 10 (the source wire 13) via the well contact hole 21. Still further, the gate electrode 7 is electrically connected to the gate pad 11 via the gate contact hole 23.

Although not shown, a protective film of polyimide or nitride is disposed on the interlayer insulating film 15 so as to cover at least the source electrode 10.

The SiC substrate 1 has a back main surface (opposite the main surface provided with the drift layer 2) provided with a drain electrode 20 (second main electrode).

Figure 4:
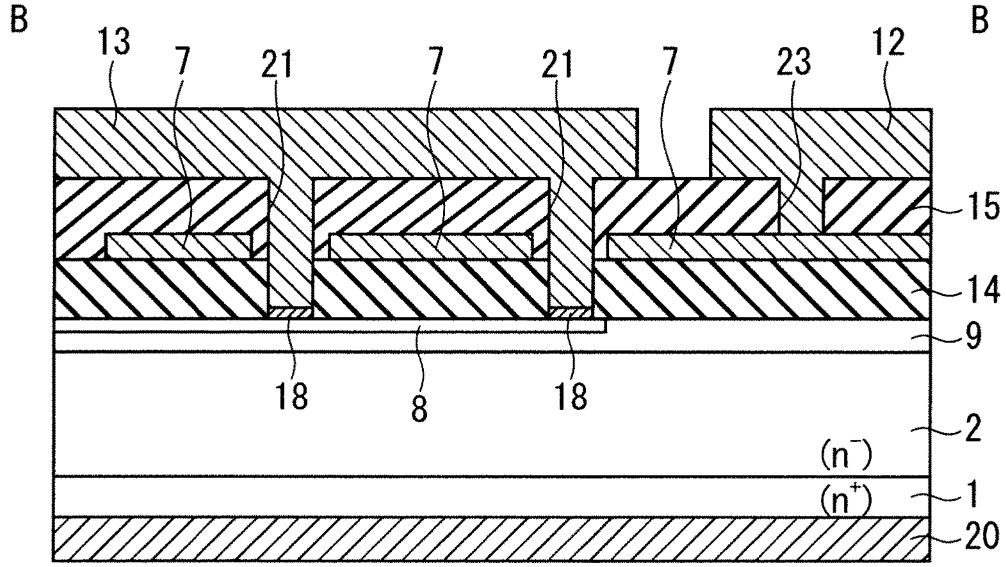
FIG. 4 is a cross-sectional view of the configuration of the silicon carbide semiconductor device according to the first embodiment of the present invention.

The following describes the configuration of a cross-section taken along line B-B in FIG. 1, with reference to a cross-sectional view in FIG. 4. As illustrated in FIG. 4, the outer-periphery contact region 8 extends along the source wire 13. Moreover, the gate wire 12 is disposed on the interlayer insulating film 15, and fills the gate contact hole 23, which penetrates the interlayer insulating film 15. Accordingly, the gate electrode 7 is electrically connected to the gate wire 12. Further, the gate wire 12 is electrically connected to the gate pad 11 via the gate electrode 7.

Here, the shape of each impurity region in plan view will be described with reference to FIG. 5. FIG. 5 illustrates the shapes of the well region 3, the source region 4, the contact region 5, the outer-periphery contact region 8, the outer-periphery well region 9, and the guard ring region GR in plan view, all of which are disposed within the drift layer 2. FIG. 5 is a plan view corresponding to FIG. 2, and omits the configuration that is located upper from the uppermost surface of the drift layer 2.

As illustrated in FIG. 5, the well region 3 and the source region 4 in the cell arrangement region concentrically surround the contact region 5 in plan view, and constitute a unit cell UC. The outer-periphery well region 9 is disposed in the outer peripheral region around the cell arrangement region, and has a surface within which the outer-periphery contact region 8 is disposed along the cell arrangement region and is adjacent to the cell arrangement region.

The outer-periphery contact region 8 also surrounds a region (not shown) below the gate pad 11. The outer-periphery contact region 8 in FIG. 5 is a continuous linear region. Such a configuration facilitates the entrance of a displacement current generated in the outer-periphery well region 9, and thus enables the displacement current to certainly flow through the source electrode 10 via the well contact holes 21.

The outer-periphery contact region 8 may be in any form. A plurality of discontinuous, local impurity regions may be disposed, as the outer-periphery contact regions 8, around the cell arrangement region and around the region (not shown) below the gate pad 11. In this case, the well contact holes 21 need to be provided to correspond to the respective outer-periphery contact regions 8.

Figure 6:
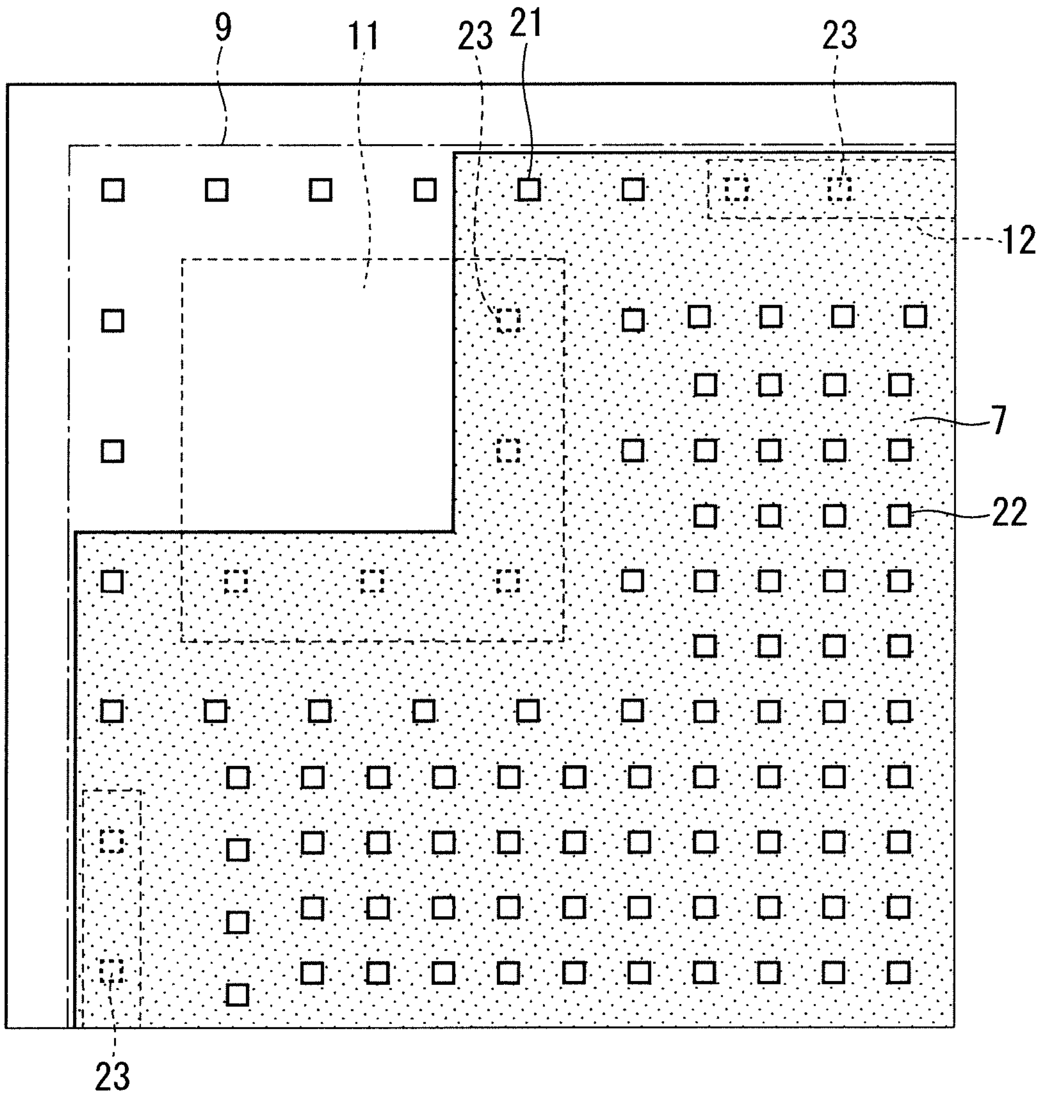
FIG. 6 is a plan view of the shape of a gate electrode of the silicon carbide semiconductor device according to the first embodiment of the present invention.

With reference to FIG. 6, the following describes the shape of the gate electrode 7 in plan view. FIG. 6 is a plan view of the shape of the gate electrode 7 disposed in the cell arrangement region and the outer peripheral region. FIG. 6 corresponds to FIG. 2. The components except the gate electrode 7 and the source contact holes 22 are indicated by dashed lines or omitted.

As illustrated in FIG. 6, the gate electrode 7 in the cell arrangement region covers the spaces between the source contact holes 22 arranged in matrix. The gate electrode 7 in the peripheral region is electrically connected to the gate pad 11 and the gate wire 12 through the gate contact holes 23.

The following describes an effect of the silicon carbide MOSFET 100. As earlier described with reference to FIG. 2, the well contact holes 21 are arranged under the source wire 13 and the source electrode 10, along the four sides of the gate pad 11. As earlier described with reference to FIG. 3, the well contact holes 21 are electrically connected to the outer-periphery well region 9 via the outer-periphery contact region 8.

Let the silicon carbide MOSFET 100 switch from ON to OFF in such a configuration. Then, the displacement current, generated in the outer-periphery well region 9, also enters the outer-periphery contact region 8 below the source wire 13, and thus has a short path, as indicated by an arrow VC in FIG. 3. As such, the displacement current during the switching lowers a potential difference (i.e., suppresses a potential gradient) generated under the gate pad. This suppresses the dielectric breakdown of the insulating film under the gate pad.

Figure 7:
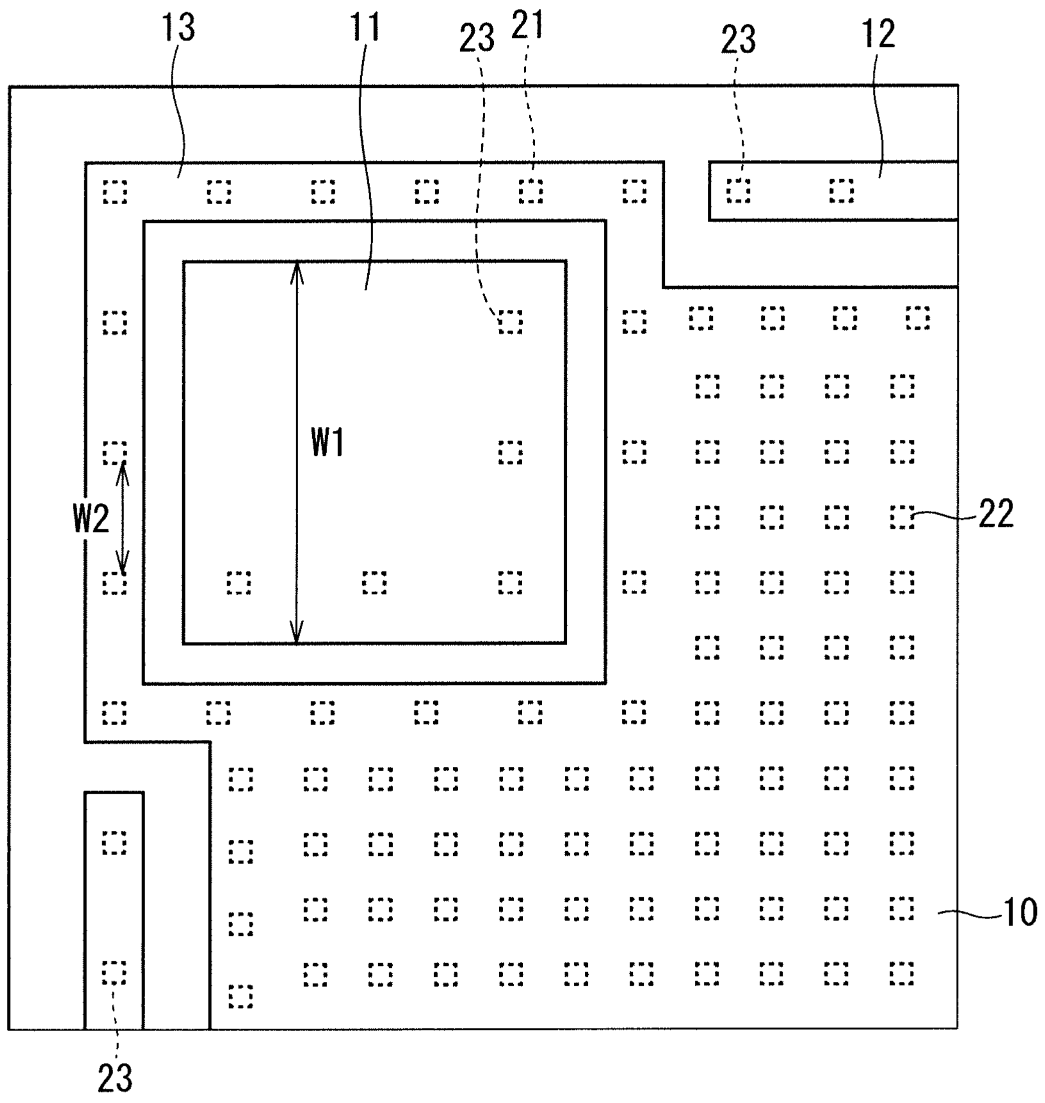
FIG. 7 is a diagram illustrating intervals between well contact holes.

Here, as illustrated in FIG. 7, the interval W2 between the well contact holes 21 is desirably set to be equal to or less than half the minimum width of the gate pad 11. That is, the path length of the displacement current, generated in the outer-periphery well region 9 under the gate pad, is geometrically specified by the shortest distance from the center of the gate pad 11 to the well contact hole 21. The shortest distance is longer than half the minimum width W1 of the gate pad 11. As such, setting the interval between the well contact holes 21 to be equal to or less than half the minimum width of the gate pad 11 brings the path length of the displacement current close to half the minimum width of the gate pad 11, and enables the displacement current to flow from the middle of the gate pad 11 toward the periphery through by way of paths having almost equal lengths. This lowers a resultant potential difference.

Furthermore, since the gate pad 11 in FIG. 7 is a square in plan view and its minimum width is identical to the length of any of the four sides, the length of one of the four sides is defined as the minimum width for convenience. When the gate pad 11 is a rectangle, the length of its shorter side is defined as the minimum width. When the gate pad 11 is a polygon other than a quadrangle, a geometrically specified, minimum length is defined as the minimum width.

<Modification>

As illustrated in FIG. 2, the silicon carbide MOSFET 100 includes the following: the gate pad 11 surrounded by the source electrode 10 and the source wire 13; and the well contact holes 21 arranged under the source wire 13 and the source electrode 10, along the four sides of the gate pad 11.

As earlier described with reference to FIG. 5, the source wire 13 and the well contact holes 21 under the source wire 13 may be omitted when the outer-periphery contact region 8 is provided to surround the region below the gate pad 11. That is, the displacement current, generated in the outer-periphery well region, flows through the outer-periphery contact region 8 surrounding the region below the gate pad 11, and then enters the source electrode 10 via the well contact holes 21. This eliminates the need for the source wire 13. Such a configuration shortens the path of the displacement current and reduces a potential difference under the gate pad resulting from the displacement current, thus suppressing the dielectric breakdown of the insulating film under the gate pad.

Figure 9:
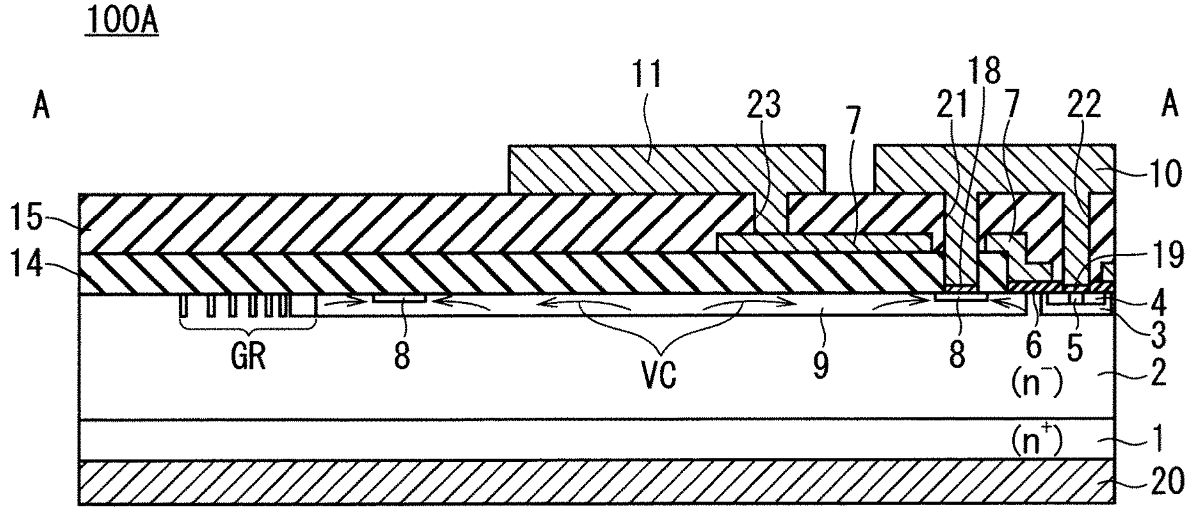
FIG. 9 is a cross-sectional view of the configuration of the silicon carbide semiconductor device according to the modification of the first embodiment.
Figure 10:
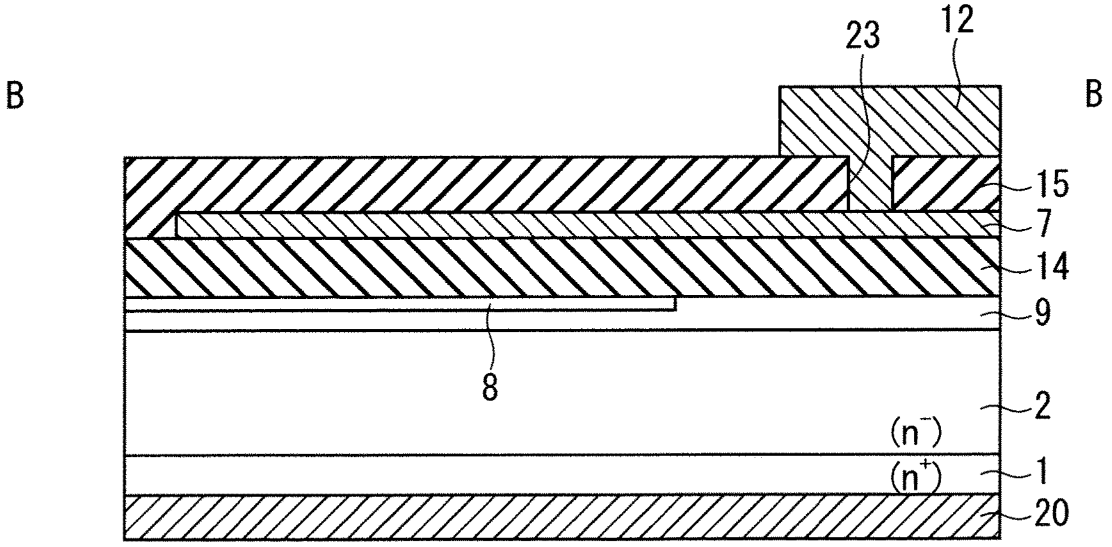
FIG. 10 is a cross-sectional view of the configuration of the silicon carbide semiconductor device according to the modification of the first embodiment.

FIG. 8 is a plan view of the configuration of a silicon carbide MOSFET 100A that does not include the source wire 13 and the well contact holes 21 under the source wire 13. FIG. 8 corresponds to FIG. 2. FIG. 9 is a cross-sectional view taken along line A-A in FIG. 8. FIG. 10 is a cross-sectional view taken along line B-B in FIG. 8.

It is noted that the silicon carbide MOSFET 100A, which does not include the source wire 13 and the well contact holes 21 thereunder, can include the gate wire 12 that extends to be directly connected to the gate pad 11.

FIG. 11 is a plan view of the configuration of a silicon carbide MOSFET 100B that includes not the source wire 13, but the gate wire 12 that extends to be directly connected to the gate pad 11. FIG. 11 corresponds to FIG. 2. As illustrated in FIG. 11, the direct connection between the gate wire 12 and the gate pad 11 suppresses gate signal delay.

<Manufacture Method>

The following describes a method for manufacturing the silicon carbide MOSFET 100 with reference to FIGS. 12 to 16, which are cross-sectional views of sequential process steps.

As illustrated in FIG. 12, at first, the drift layer 2 of n-type is epitaxially grown onto one main surface (front main surface) of the SiC substrate 1 through chemical vapor deposition (CVD). The drift layer 2 is a semiconductor layer of silicon carbide.

The SiC substrate 1 is 50 to 500 μm thick, and contains n-type impurities in a range of $1\times10^{19}$ to $1\times10^{21}$ $cm^{-3}$. The drift layer 2 is 1 to 60 μm thick, and contains the n-type impurities in a range of $1\times10^{15}$ to $1\times10^{17}$ $cm^{-3}$. The thickness of the drift layer 2 is one example, and depends on a breakdown voltage (voltage to be uses) necessary for the silicon carbide MOSFET 100.

Formed onto the drift layer 2 is a resist mask (not shown) having openings so that regions to be the well regions 3 and the outer-periphery well region 9 are exposed, through photolithography. This resist mask is used as a mask for preventing impurity injection.

The resist mask, after formed, undergoes ion implantation of p-type impurities from above to thus selectively form the well regions 3 in the upper layer of the drift layer 2 in the cell arrangement region and to form the outer-periphery well region 9 in the upper layer of the drift layer 2 in the outer peripheral region. Here, the well region 3 and the outer-periphery well region 9 are 0.5 to 1.0 μm deep (thick) from the outermost surface of the drift layer 2. In addition, the p-type impurity is made of Al or B, and has a concentration ranging from $1\times10^{17}$ to $5\times10^{19}$ $cm^{3}$.

After resist mask removal, another new resist mask (not shown) is formed that has openings so that regions to be the source regions 4 are exposed, through photolithography. This resist mask is also used as a mask for preventing impurity injection.

The resist mask, after formed, undergoes ion implantation of n-type impurities from above to thus form the source regions 4 in the upper layer of the well regions 3. Here, the source region 4 is 0.2 to 0.5 μm deep (thick) from the outermost surface of the drift layer 2. In addition, the n-type impurity is made of nitrogen (N) or phosphorus (P), and has a concentration ranging from $5\times10^{18}$ to $5\times10^{20}$ $cm^{-3}$.

After resist mask removal, another new resist mask (not shown) is formed that has openings so that regions to be the contact regions 5 and the outer-periphery contact region 8 are exposed, through photolithography. This resist mask is also used as a mask for preventing impurity injection.

The resist mask, after formed, undergoes ion implantation of p-type impurities from above to thus form the contact regions 5 in the middle of the source regions 4 in the cell arrangement region and to form the outer-periphery contact region 8 in the outer peripheral region. Here, the contact region 5 and the outer-periphery contact region 8 are 0.2 to 0.5 μm deep (thick) from the outermost surface of the drift layer 2. In addition, the p-type impurity is made of Al or B, and has a concentration ranging from $1\times10^{18}$ to $5\times10^{20}$ $cm^{-3}$.

After resist mask removal, another new resist mask (not shown) is formed that has openings so that regions to be the guard ring regions GR are exposed, through photolithography. This resist mask is also used as a mask for preventing impurity injection.

The resist mask, after formed, undergoes ion implantation of p-type impurities from above to thus form the guard ring regions GR in the upper layer of the drift layer 2 on the further outside of the outer-periphery well region 9. Here, the guard ring region GR is 0.5 to 1.0 μm deep (thick) from the outermost surface of the drift layer 2. In addition, the p-type impurity is made of Al or B, and has a concentration ranging from $1\times10^{16}$ to $1\times10^{18}$ $cm^{3}$.

After resist mask removal, the drift layer 2 undergoes high-temperature annealing at 1500° C. or higher to activate the n-type and p-type impurities as injected.

Next, an oxide film ($SiO_2$) is formed onto the drift layer 2 through, for instance, CVD. The subsequent step is forming, through photolithography, an etching mask having an opening so that the cell arrangement region is exposed, followed by removing the oxide film in the cell arrangement region through etching with the etching mask. This forms, as illustrated in FIG. 13, the field insulating film 14 on the drift layer 2 in the outer peripheral region. The field insulating film 14 is 0.5 to 2 μm thick.

Then, in a process step illustrated in FIG. 14, the SiC substrate 1 (including the aforementioned components) is exposed to an about 1000° C. atmosphere containing oxygen and steam to thus thermally oxidize a surface of the cell arrangement region and thus form the gate insulating film 6, which is a thermally oxidized film ($SiO_2$). The gate insulating film 6 is 0.3 to 1 μm thick.

It is noted that the gate insulating film 6, although being a thermally oxidized film in the above description, may be an oxide film formed through CVD.

The next step is forming a polycrystalline silicon film containing $1\times10^{19}$ to $1\times10^{21}$ $cm^{-3}$ of phosphorus (P) onto the gate insulating film 6 and the field insulating film 14 through CVD. The polycrystalline silicon film is 0.3 to 1 μm thick. It is noted that the polycrystalline silicon film may be formed of a p-type polycrystalline silicon film containing B.

Figure 15:
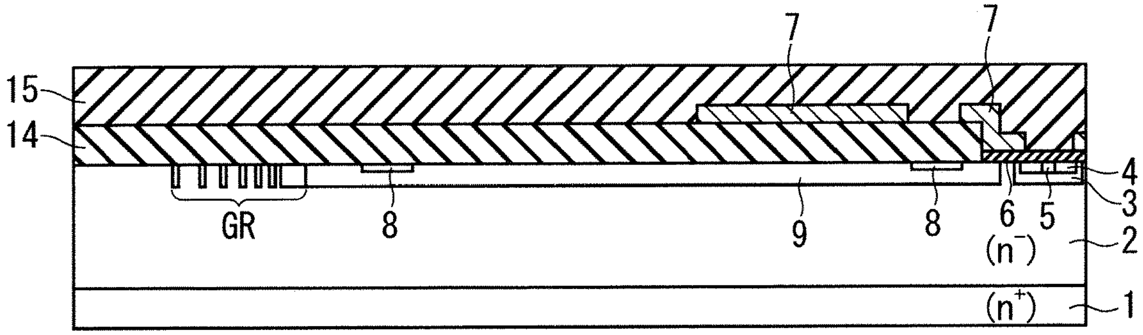
FIG. 15 is a cross-sectional view of a process step in manufacturing the silicon carbide semiconductor device according to the first embodiment of the present invention.
Figure 16:
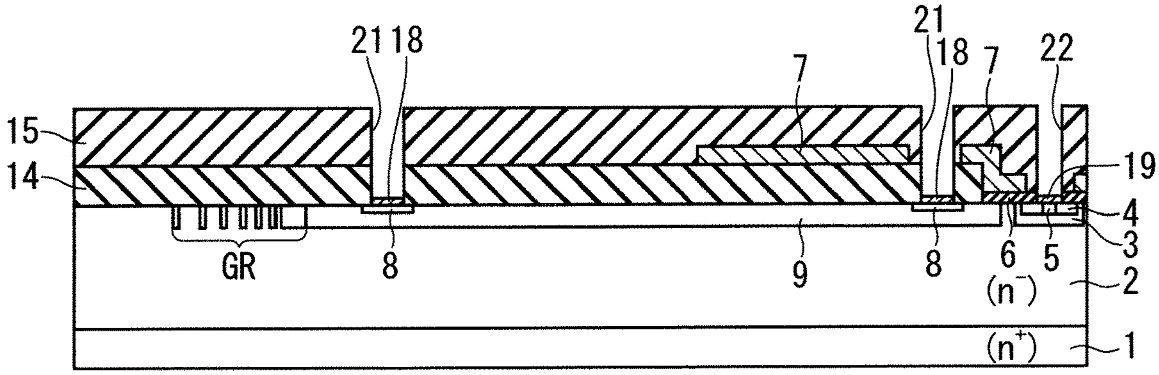
FIG. 16 is a cross-sectional view of a process step in manufacturing the silicon carbide semiconductor device according to the first embodiment of the present invention.

Subsequently, formed through photolithography is an etching mask having an opening where the polycrystalline silicon film above the source regions 4 and the contact regions 5 is exposed in the cell arrangement region, and having an opening where the polycrystalline silicon film below the gate pad 11 is exposed in the outer peripheral region. Then, the polycrystalline silicon film, exposed from these openings, is removed through etching with the etching mask. As illustrated in FIG. 15, this process step removes the gate electrode 7 above the source region 4 and the contact region 5 in the cell arrangement region, and leaves the gate electrode 7 unremoved from the JFET region to the edge of the well region 3 in the cell arrangement region. In addition, the gate electrode 7 remains unremoved below the gate pad 11 in the outer peripheral region.

The next step is forming a silicon oxide film having a thickness of 0.5 to 2 μm onto the enter surface of the SiC substrate 1 (including the aforementioned components) through, for instance, CVD. This silicon oxide film is the interlayer insulating film 15. Subsequently, an etching mask is formed that has openings so that the interlayer insulating film 15 above the contact regions 5 and the surrounding source regions 4 are exposed in the cell arrangement region. The following step is removing the interlayer insulating film 15, exposed in these openings, and the gate insulating film 6 under the interlayer insulating film 15 through etching with the etching mask. This removal forms the source contact holes 22 (FIG. 3) reaching the contact regions 5 and the surrounding source regions 4. The etching mask has openings so that the interlayer insulating film 15 above the outer-periphery well region 9 is exposed in the outer peripheral region. Removing, through etching, the interlayer insulating film 15 and the field insulating film 14, which are exposed in these openings, forms the well contact holes 21 reaching the outer-periphery well region 9. Wet etching or dry etching, or both can be applied in this etching process.

After etching-mask removal, a Ni film having a thickness of 30 to 100 nm is formed onto the front main surface of the SiC substrate 1 through, for instance, sputtering, followed by annealing. This forms a metal silicide film (herein, a $NiSi_2$ film) in the upper parts of each source region 4 and each contact region 5, which are exposed to the bottom surface of the source contact hole 22, and in the upper part of the outer-periphery contact region 8, which is exposed to the bottom surface of the well contact hole 21.

Here, the Ni film undergoes heating at 300 to 800° C. for 1 to 3 minutes using a method, such as rapid thermal annealing (RTA). The heating at this range of temperature causes Ni in the Ni film to react to SiC in contact with the Ni film, thus forming the source contact film 19 (FIG. 3) on the contact regions 5 and the source regions 4, and also forming the outer-periphery well contact film 18 (FIG. 3) on the outer-periphery contact region 8. The Ni film that is not in contact with SiC does not react and thus remains as Ni is.

After the silicide film formation, the SiC substrate 1 is cleaned in an acid solution containing sulfuric acid or hydrochloric acid. This cleaning process removes the Ni film that remains unreacted in the reaction for conversion into a silicide. Removing the unreacted Ni film obtains a configuration illustrated in FIG. 16.

Subsequently, formed through photolithography is an etching mask having a plurality of openings so that the interlayer insulating film 15 above the gate electrode 7 in regions where the gate pad 11 (FIG. 2) and the gate wire 12 (FIG. 2) are to be formed, is exposed. The following step is removing the interlayer insulating film 15, exposed in theses openings, through etching to thus form the gate contact holes 23 reaching the gate electrode 7. This etching process can use the same method as the etching process for forming the source contact holes 22.

After that, the front main surface of the SiC substrate 1 undergoes sputtering or vapor deposition to form an Al film having a thickness of 1 to 5 μm, followed by filling the well contact holes 21, the source contact holes 22, and the gate contact holes 23.

Next, formed through photolithography is an etching mask having openings in portions other than the upper parts of regions in which the source electrode 10, the gate pad 11, the gate wire 12, and the source wire 13 are to be formed. Then, the Al film undergoes etching using the etching mask to form the source electrode 10, the gate pad 11, the gate wire 12, and the source wire 13.

Finally, the back main surface of the SiC substrate 1 undergoes sputtering or vapor deposition to form a Ni film having a thickness of 0.1 to 5 μm. This Ni film is the drain electrode 20. Through these process steps, the silicon carbide MOSFET 100 in FIG. 3 is completed.

Second Embodiment

Figure 17:
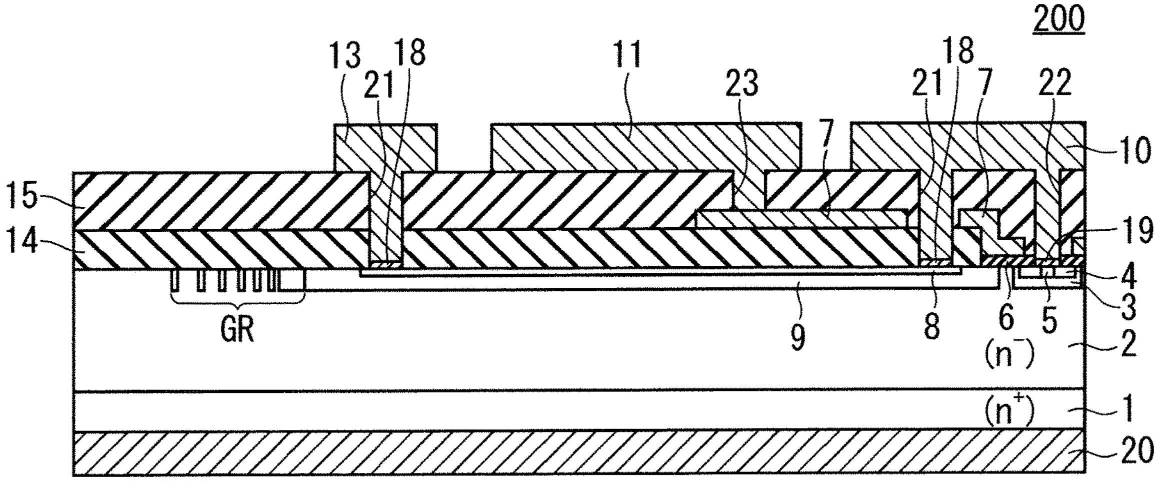
FIG. 17 is a cross-sectional view of the configuration of a silicon carbide semiconductor device according to a second embodiment of the present invention.

As illustrated in FIGS. 3 and 5, the silicon carbide MOSFET 100 in the first embodiment includes the outer-periphery contact region 8 disposed within the surface of the outer-periphery well region 9 so as to surround the region below the gate pad 11. As illustrated in FIG. 17, the outer-periphery contact region 8 may be disposed all over the outer-periphery well region 9 below the gate pad 11. Such an outer-periphery contact region 8 is included in a silicon carbide MOSFET 200 in a second embodiment.

Figure 18:
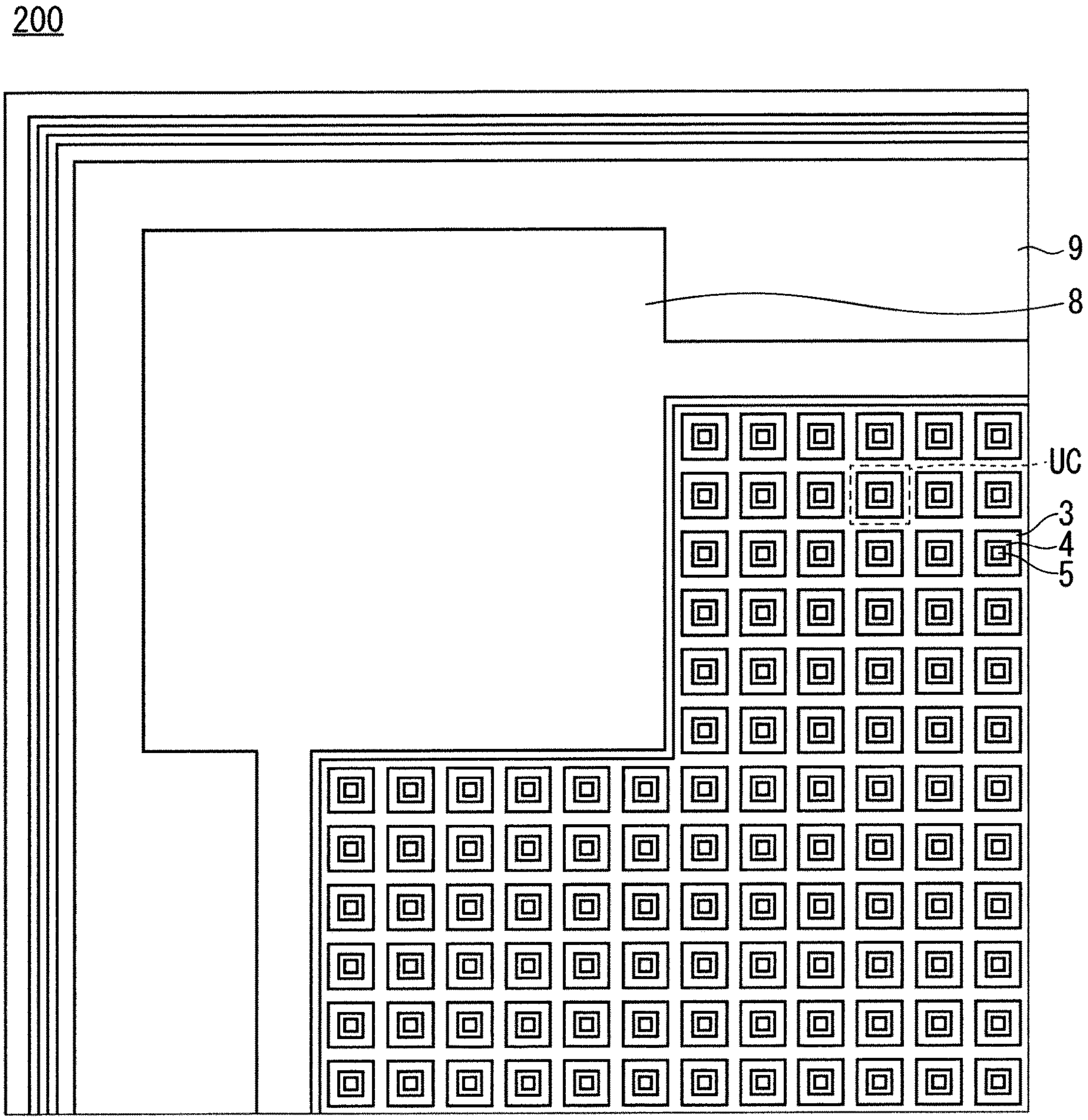
FIG. 18 is a plan view of the shape of an impurity region of the silicon carbide semiconductor device according to the second embodiment of the present invention.

FIG. 18 illustrates the shape of each impurity region in plan view, and corresponds to FIG. 5. As illustrated in FIG. 18, the outer-periphery contact region 8 extends along the cell arrangement region. The outer-periphery contact region 8 also extends to a region corresponding to a portion below the gate pad 11 (not shown) and extends to its surrounding region.

Such a configuration lowers the sheet resistance of the outer-periphery well region 9, thereby further suppressing the potential gradient when the displacement current flows.

The outer-periphery contact region 8, which has the same concentration and the same depth as the contact regions 5 in the cell arrangement region, is formed simultaneously with the contact regions 5. This simplifies the process steps in manufacture. It is noted that the terms, "the same concentration" and "the same depth" do not limited to an exact match; these terms include a margin of error ranging from −20 to +20%.

Third Embodiment

The silicon carbide MOSFET 100 in FIG. 1 includes the following: the source wire 13 extending along two of the four sides of the gate pad 11, at the corner of the silicon carbide MOSFET 100; the gate pad 11 that is substantially an island surrounded by the source electrode 10; and the gate wire 12 that is divided by the source electrode 10 and is not directly connected to the gate pad 11.

A silicon carbide MOSFET 90 in FIG. 19 is configured such that the gate wire 12 is directly connected to the gate pad 11, and that the gate pad 11 is substantially surrounded by the source electrode 10.

That is, the silicon carbide MOSFET 90 is configured such that the source wire 13 surrounds the outermost periphery of the SiC substrate 1, thus connecting the gate wire 12 to the gate pad 11, and that the source wire 13 extends along two of the four sides of the gate wire 12, at the corner of the silicon carbide MOSFET 90. As a matter of course, the outer-periphery contact region 8 is disposed below the source wire 13, and is electrically connected to the source wire 13 via the well contact holes 21.

The source wire 13 surrounds the outermost periphery of a chip including the silicon carbide MOSFET 90. Here, let the sum of W3 and W4 be 50 μm, where W3 denotes the width of the source wire 13, where W4 denotes the width of a gap between the gate wire 12 and the source wire 13. For a chip size of 1 cm×1 cm, the area of an invalid region is 50 μm×10 mm×4=2 $mm^2$; thus the invalid region needs to make up about 2% of the entire chip. For a chip size of 3 mm×3 mm, the area of the invalid region is 50 μm×3 mm×4=0.6 $mm^2$; and thus the invalid region needs to make up about 6.7% of the entire chip. SiC wafers, which are more expensive than Si wafers, involve an increase in invalid region, thus highly increasing manufacture cost. Hence, the invalid region should be as small as possible.

The silicon carbide MOSFET 100 in FIG. 1 reduces the invalid region and thus lowers chip cost. Meanwhile, the gate wire 12 is electrically connected to the gate pad 11 via the gate electrode 7 of polycrystalline silicon. Such a configuration is suitable to increase the resistance of an integrated gate resistor.

That is, rapid operation, which is an advantage of a silicon carbide MOSFET, can cause a disadvantage, such as a noise generation phenomenon. In this case, integrating a gate resistor can regulate switching speed. This integration involves a gate resistor between a gate pad and a gate wire. The configuration in which the gate pad 11 is not directly connected to the gate wire 12 facilitates the integration of a gate resistor having a high resistance.

FIG. 20 is a partial plan view of the configuration of a silicon carbide MOSFET 300 according to a third embodiment of the present invention. FIG. 20 corresponds to FIG. 2.

As illustrated in FIG. 20, the silicon carbide MOSFET 300 includes a gate pad surrounded by the source electrode 10. This gate pad is divided into a gate pad 111 (second portion) having a rectangular shape in plan view, and a gate pad 112 (first portion) having an L-shape in plan view.

That is, the gate pad 111 is adjacent to one corner of the silicon carbide MOSFET 300. In addition, the gate pad 112 is remote from the corner, and has an L-shape extending to face two orthogonal sides of the gate pad 111. The gate electrode 7 is disposed below the gate pad 111 and the gate pad 112 so as to extend between both. This gate electrode 7 is an integrated gate resistor.

Figure 21:
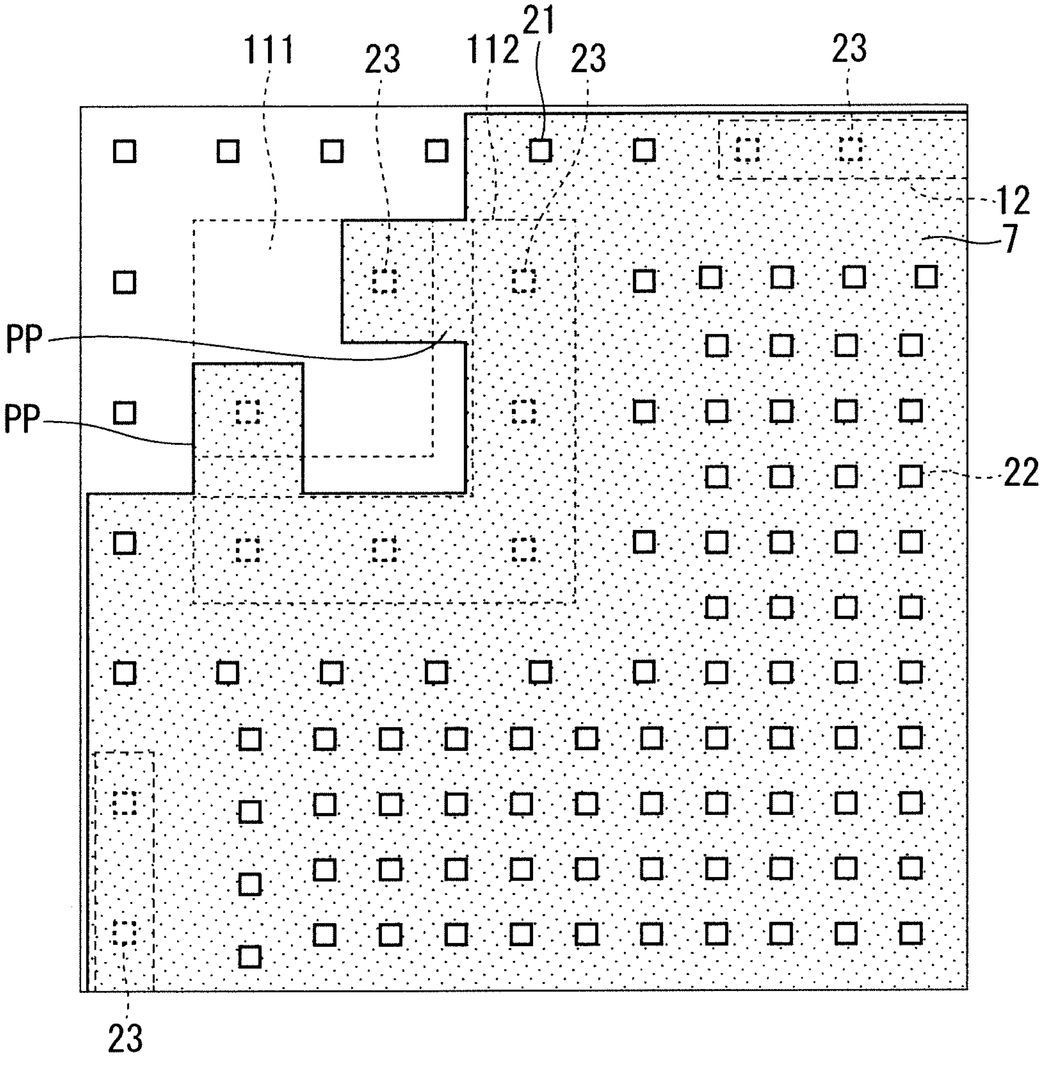
FIG. 21 is a plan view of the shape of a gate electrode of the silicon carbide semiconductor device according to the third embodiment of the present invention.

FIG. 21 is a plan view of the shape of the gate electrode 7 disposed in the cell arrangement region and the outer peripheral region. FIG. 21 corresponds to FIG. 20. The components except the gate electrode 7 and the source contact holes 22 are indicated by dashed lines or omitted.

As illustrated in FIG. 21, the gate electrode 7 is electrically connected to the gate pad 112 and the gate wire 12 via the gate contact holes 23 in the peripheral region. Further, the gate electrode 7 partly protrudes to extend between a region below the gate pad 112 and a region below the gate pad 111. These protrusions, PP, are integrated gate resistors. It is noted that the protrusions PP of the gate electrode 7, although in FIG. 21, located in two sites corresponding portions below both ends of the L-shaped gate pad 112, may be located anywhere, and may be located in a single site or more than two sites.

Width and length regulation or number regulation in the protrusion PP of the gate electrode 7 sets the resistance of the integrated gate resistor and regulates switching speed.

As a matter of course, the silicon carbide MOSFET 300, in addition to the aforementioned effect, reduces the potential difference under the gate pad resulting from the displacement current during switching, and thus suppresses the dielectric breakdown of the insulating film under the gate pad.

<Other Applications>

The first to third embodiments each disclose that a semiconductor device is a vertical MOSFET. As illustrated in FIG. 22, the SiC substrate 1 of n-type can have a back main surface that is provided with a SiC layer 30 of p-type containing a relatively high concentration of p-type impurities ($p^+$), and that is provided with the drain electrode 20 (collector electrode) on the SiC layer 30. An insulated-gate bipolar transistor (IGBT) is consequently obtained. It is noted that forming the p-type SiC layer 30 may include forming a drift layer 2 onto the front main surface of the SiC substrate 1, and then injecting, through ion implantation, a relatively high concentration ($p^+$) of p-type impurities into the back main surface of the SiC substrate 1. Alternatively, the p-type SiC layer 30 may be formed onto the back main surface of the SiC substrate 1 through epitaxial growth; then, the drift layer 2 may be formed onto the front main surface of the SiC substrate 1 through epitaxial growth. In this case, the front main surface of the SiC substrate 1 may undergo chemical mechanical polishing after the SiC layer 30 is formed, to thus form the drift layer 2.

A SiC substrate of p-type instead of the SiC substrate 1 of n-type can achieve an IGBT.

The present invention, although applied to a planar-gate MOSFET in the first to third embodiments, is applicable to a trench-gate MOSFET and a trench-gate IGBT.

While the invention has been shown and described in detail, the foregoing description is in all aspects illustrative and not restrictive. It is therefore understood that numerous modifications and variations can be devised without departing from the scope of the invention.

It is noted that in the present invention, the individual embodiments can be freely combined, or can be modified and omitted as appropriate, within the scope of the invention.

The invention claimed is:

1. A silicon carbide semiconductor device comprising:

a semiconductor substrate of silicon carbide;

a semiconductor layer having a first conductivity type and disposed on the semiconductor substrate;

a first impurity region having a second conductivity type and selectively disposed in an upper layer of the semiconductor layer;

a second impurity region having the first conductivity type and selectively disposed in an upper layer of the first impurity region;

a gate insulating film provided to be continuously in contact with the second impurity region, the first impurity region, and the semiconductor layer;

a gate electrode disposed in a position facing the second impurity region, the first impurity region, and the semiconductor layer via at least the gate insulating film;

a third impurity region having the second conductivity type, the third impurity region being disposed in the upper layer of the semiconductor layer in an outer peripheral region that is an outer periphery of a cell arrangement region in which a unit cell including the first and second impurity regions is disposed;

a field insulating film that is disposed on the semiconductor layer in the outer peripheral region, and is thicker than the gate insulating film;

an interlayer insulating film disposed on the field insulating film, the gate electrode, and the gate insulating film;

a first main electrode disposed on the interlayer insulating film;

a second main electrode disposed across the semiconductor substrate from the semiconductor layer; and a gate wire and a gate pad electrically connected to each other, wherein the third impurity region comprises a fourth impurity region having the second conductivity type, selectively disposed in an upper layer of the third impurity region, and having a higher impurity concentration than the third impurity region, the fourth impurity region is provided to surround at least a region below the gate pad, and is electrically connected to the first main electrode, and the fourth impurity region entirely surrounds the gate pad in plan view, and is electrically connected to the first main electrode via a plurality of well contact holes extending through the interlayer insulating film and the field insulating film to the fourth impurity region.

2. The silicon carbide semiconductor device according to claim 1, wherein the first main electrode is disposed above the cell arrangement region, is disposed along a side of the gate pad, the side not facing the cell arrangement region in plan view, and surrounds the gate pad in plan view.

3. The silicon carbide semiconductor device according to claim 1, wherein the fourth impurity region is continuously disposed along the cell arrangement region, and is continuously disposed along the region below the gate pad.

4. The silicon carbide semiconductor device according to claim 1, wherein the fourth impurity region is continuously disposed along the cell arrangement region, and is provided, in plan view, to extend to a first region corresponding to a portion below the gate pad and to extend to a second region that surrounds the first region.

5. The silicon carbide semiconductor device according to claim 2, wherein the plurality of well contact holes are arranged at intervals equal to or less than half a minimum width of the gate pad in plan view.

6. The silicon carbide semiconductor device according to claim 2, wherein the gate wire is disposed along an edge of the semiconductor substrate, and divided in a portion where the gate pad is disposed by the first main electrode.

7. The silicon carbide semiconductor device according to claim 6, wherein the gate pad comprises a first portion provided to face the cell arrangement region in plan view, and a second portion opposite the first portion with an interval, and the first and second portions are electrically connected to the gate electrode via a gate resistor.

8. The silicon carbide semiconductor device according to claim 1, further comprising a fifth impurity region having the second conductivity type, selectively disposed in the upper layer of the first impurity region, and comprising a side surface in contact with the second impurity region, wherein the fourth and fifth impurity regions have the same impurity concentration and the same depth.

9. A silicon carbide semiconductor device comprising:

a semiconductor substrate of silicon carbide;

a semiconductor layer having a first conductivity type and disposed on the semiconductor substrate;

a first impurity region having a second conductivity type and selectively disposed in an upper layer of the semiconductor layer;

a second impurity region having the first conductivity type and selectively disposed in an upper layer of the first impurity region;

a gate insulating film provided to be continuously in contact with the second impurity region, the first impurity region, and the semiconductor layer;

a gate electrode disposed in a position facing the second impurity region, the first impurity region, and the semiconductor layer via at least the gate insulating film;

a third impurity region having the second conductivity type, the third impurity region being disposed in the upper layer of the semiconductor layer in an outer peripheral region that is an outer periphery of a cell arrangement region in which a unit cell including the first and second impurity regions is disposed;

a field insulating film that is disposed on the semiconductor layer in the outer peripheral region, and is thicker than the gate insulating film;

an interlayer insulating film disposed on the field insulating film, the gate electrode, and the gate insulating film;

a first main electrode disposed on the interlayer insulating film;

a second main electrode disposed across the semiconductor substrate from the semiconductor layer; and a gate wire and a gate pad electrically connected to each other, wherein the first main electrode entirely surrounds the gate pad in plan view, the third impurity region comprises a fourth impurity region having the second conductivity type, selectively disposed in an upper layer of the third impurity region, and having a higher impurity concentration than the third impurity region, the fourth impurity region is provided to surround at least a region below the gate pad, and is electrically connected to the first main electrode.

* * * * *